United States Patent [19]

Broseghini et al.

[11] Patent Number: 5,761,489
[45] Date of Patent: Jun. 2, 1998

[54] METHOD AND APPARATUS FOR SCAN TESTING WITH EXTENDED TEST VECTOR STORAGE IN A MULTI-PURPOSE MEMORY SYSTEM

[75] Inventors: James L. Broseghini; John A. Langan; Thomas J. Poterek, all of Austin, Tex.

[73] Assignee: Motorola Inc., Schaumburg, Ill.

[21] Appl. No.: 422,467

[22] Filed: Apr. 17, 1995

[51] Int. Cl.$^6$ ............................................. G06F 11/26
[52] U.S. Cl. ................................. 395/568; 395/183.06
[58] Field of Search .............................. 395/309, 436, 395/183.16, 183.06, 183.07, 183.03, 568, 376; 371/22.5, 22.6

[56] References Cited

U.S. PATENT DOCUMENTS

| | | | |
|---|---|---|---|
| 4,827,476 | 5/1989 | Garcia | 371/22.3 |
| 5,173,906 | 12/1992 | Dreibel et al. | 371/22.5 |
| 5,175,494 | 12/1992 | Yoshimori | 371/22.3 |
| 5,383,143 | 1/1995 | Crouch et al. | 364/717 |
| 5,553,082 | 9/1996 | Connor et al. | 371/25.1 |

FOREIGN PATENT DOCUMENTS 2 543 709A1  10/1984  France ................. G06F 15/46

OTHER PUBLICATIONS

James Broseghini, et al., An ALU-Based Programmable MISR/Pseudorandom Generator for a MC67HC11 Family Self-Test, Proceedings of the Int'l. Test Conf., Baltimore, Oct. 17–21, 1993, pp. 349–358.

Primary Examiner—Pavshotam S. Lall
Assistant Examiner—Viet Vu

[57] ABSTRACT

A data processor (12) has built-in circuitry for scan testing certain circuits. The data processor generates and stores test vectors in a memory system (22) normally used for data and instruction storage. These vectors can be much larger than the size of any scan chain. During testing, the stored vectors are automatically routed to the circuits to be tested (36, 38) and the outputs compared to a benchmark. The data processor (12) need not pause to generate additional test vectors. Therefore, the data processor (12) can use a single circuit to generate scan data and compress scan results with minimal timing or size implications.

8 Claims, 4 Drawing Sheets

METHOD AND APPARATUS FOR SCAN TESTING WITH EXTENDED TEST VECTOR STORAGE IN A MULTI-PURPOSE MEMORY SYSTEM

REFERENCE TO RELATED APPLICATION

The present application is related to the following U.S. patent application: entitled "A Method and Apparatus for Generating Pseudo-Random Numbers or for Performing Data Compression in a Data Process, invented by James L. Broseghini, et al., filed Aug. 9, 1993, and having Ser. No. 08/103,614, now U.S. Pat. No. 5,416,783.

FIELD OF THE INVENTION

The present invention generally relates to digital computing systems, and more specifically to the self-testing of an integrated circuit.

BACKGROUND OF THE INVENTION

Many integrated circuits incorporate some form of test capability. The MC68HC11 family of microcontrollers (available from Motorola, Inc. of Austin, Tex.) uses a bootstrap mode which can be used in conjunction with a serial communications interface to perform a self-test. The MC68HC11 bootstrap mode uses self-test software which is loaded into the on-board random access memory ("RAM") by means of the serial communications interface. The 80486 microprocessor (available from Intel Corp. of Santa Clara, Calif.) has also built-in, self-test ("BIST") capability.

BIST scan testing is a common testing methodology, well-known in the art, which can be used to test the various circuits of an integrated circuit device. In BIST, test circuitry within the integrated circuit device generates test vectors according to a programmed function. These vectors are routed to the various circuits to be tested through a series of serially-coupled Scan-input latches. These Scan-input latches are connected to the various circuits. During testing, the test vectors are inputted to the various circuits where they are processed as normal data. The outputs of the various circuits are collected by Scan-output latches and rerouted to the arithmetic logic unit ("ALU") in the central processing unit ("CPU") of the integrated circuit. The test circuitry in the ALU compresses the output test data according to the programmed function and outputs a final value to a user for evaluation.

The number of test vectors which can be generated during one scan test, however, has been limited by the memory storage capacity of the Scan-input latches. According, in many instances several scan tests comprising the steps of generating vectors and then compressing the output of the circuits under test to generate a final value must be conducted to adequately do a complete self-test on an integrated circuit.

To a certain extent, the scope of testability of an integrated circuit device is a function of how much time the device may spend generating test vectors, executing the vectors, and outputting the results for evaluation. Typically, steps that require an input or output from the integrated circuit device under test or outputting a final value to a user takes up the bulk of the testing time. Therefore, testing coverage can be increased if the required input/output steps are minimized.

BRIEF DESCRIPTION OF THE DRAWINGS

The feature and advantages of the present invention will be more clearly understood from the following detailed description taken in conjunction with the accompanying FIGURES where like numerals refer to like and corresponding parts and in which.

DETAILED DESCRIPTION OF A PREFERRED EMBODIMENT

Figure 1:
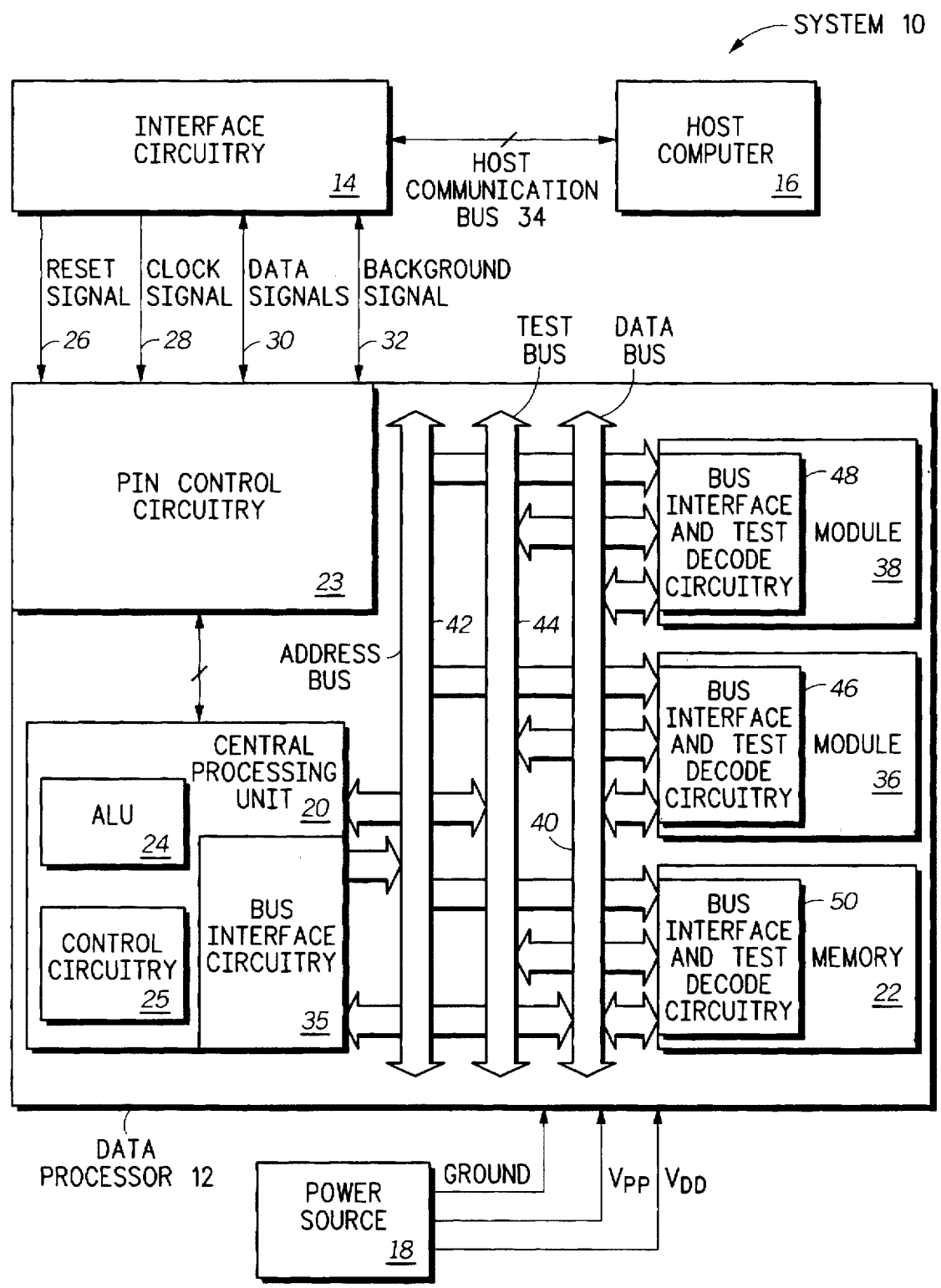
FIG. 1 illustrates, in block diagram form, a system for built-in self-testing of a data processor in accordance with one embodiment of the present invention.

FIG. 1 depicts a system 10 for scan testing a data processor 12 according to the disclosed invention. The system 10 includes the data processor 12 under test, interface circuitry 14, a host computer 16, and a power source 18. Data processor 12 receives power (VDD) and ground voltages from power supply 18. In some embodiments of the present invention, data processor 12 also receives a high voltage level (VPP) from power supply 18.

The data processor 12 includes a CPU 20. The CPU 20 is bidirectionally coupled to pin control circuitry 23 for communications with interface circuitry 14. Control lines 26, 28, 30, and 32 connect the pin control circuitry 23 to interface circuitry 14 in order for the data processor 12 to receive a reset signal, clock signals, data I/O signals, and a background signal, respectively, from the interface circuitry 14. Interface circuitry 14 is bidirectionally coupled to host computer 16 by way of host communication bus 34.

CPU 20 of data processor 12 includes control circuitry 35 for background mode commands, including microcode, which is used to control portions of CPU 20 during the execution of the background mode commands. Control circuitry 35, together with additional built-in scan test circuitry within processor 12 to be described hereinafter, permits the system 10 to conduct a scan test on the data processor 12 with an extended set of test vectors without running numerous tests flows which require additional commands through the interface circuitry 14 to the data processor 12.

CPU 20 of data processor 12 also includes an arithmetic logic unit ("ALU") 24 which generates test vectors according to a programmed function. These vectors are routed through a series of serially-coupled, Scan-input latches to circuits or circuit modules within data processor 12 selected to be tested. During testing, the test vectors are inputted to the various circuits where they are processed as normal data. The outputs of the various circuits are then collected by Scan-output latches and rerouted to the ALU 24. The ALU 24 compresses the output test data according to the programmed function and outputs a final value to a user for evaluation. Each step of inputting to or outputting from the data processor 12 under test previously required a relatively long time. A suitable ALU 24 is fully described in an application for U.S. Patent entitled "A Method and Apparatus for Generating Pseudo-Random Numbers or for Performing Data Compression in a Data Processor" Ser. No. 08/103,614, filed Aug. 9, 1993, now U.S. Pat. No. 5,416,783 and incorporated herein by reference.

According to the disclosed invention, data processor 12 also incorporates a memory system 22 which normally stores instructions and/or data for use by data processor 12. During testing, the ALU 24, first acting as a test vector generator, stores its test vectors in the memory system 22. Later, the ALU 24 configures itself into a data compression circuit. Simultaneously, the memory system 22 automatically outputs the entire set of test vectors onto the Scan-in conductors chaining through the Scan-in latches and the circuits under test. This design strategy allows as large a set of test vectors as will fit in the memory system 22 to be applied to various modules in data processor 12: memory system 22, module 36, module 38, and any other module in data processor 12. In most embodiments, such a large set of test vectors only requires that the ALU 24 output one final value for evaluation, thereby shortening the time required to fully test the data processor 12.

Continuing with FIG. 1, CPU 20 has bus interface circuitry 35 which may be coupled to data bus 40, address bus 42, and test lines 44. Data processor 12 also has a plurality of circuits or circuit modules, such as module 36 and 38, which may be coupled to CPU 20 by way of data bus 40, address bus 42 and test lines 44. Module 36 has bus interface and test decode circuitry 46 which is coupled to data bus 40, address bus 42, and test lines 44. Module 38 has bus interface and test decode circuitry 48 which is coupled to data bus 40, address bus 42, and test lines 44.

The memory system 22 also has bus interface and test decode circuitry 50 which is coupled to data bus 40, address bus 42, and test lines 44 for communications with the CPU 20. In normal operation, the CPU 20 randomly accesses the memory in the memory system 22 in a conventional manner for reading and writing to memory. The bus interface and test decode circuitry 50, however, contains circuitry which will be described hereinafter which permits the memory system 22 to store test vectors during the background test mode.

Figure 2:
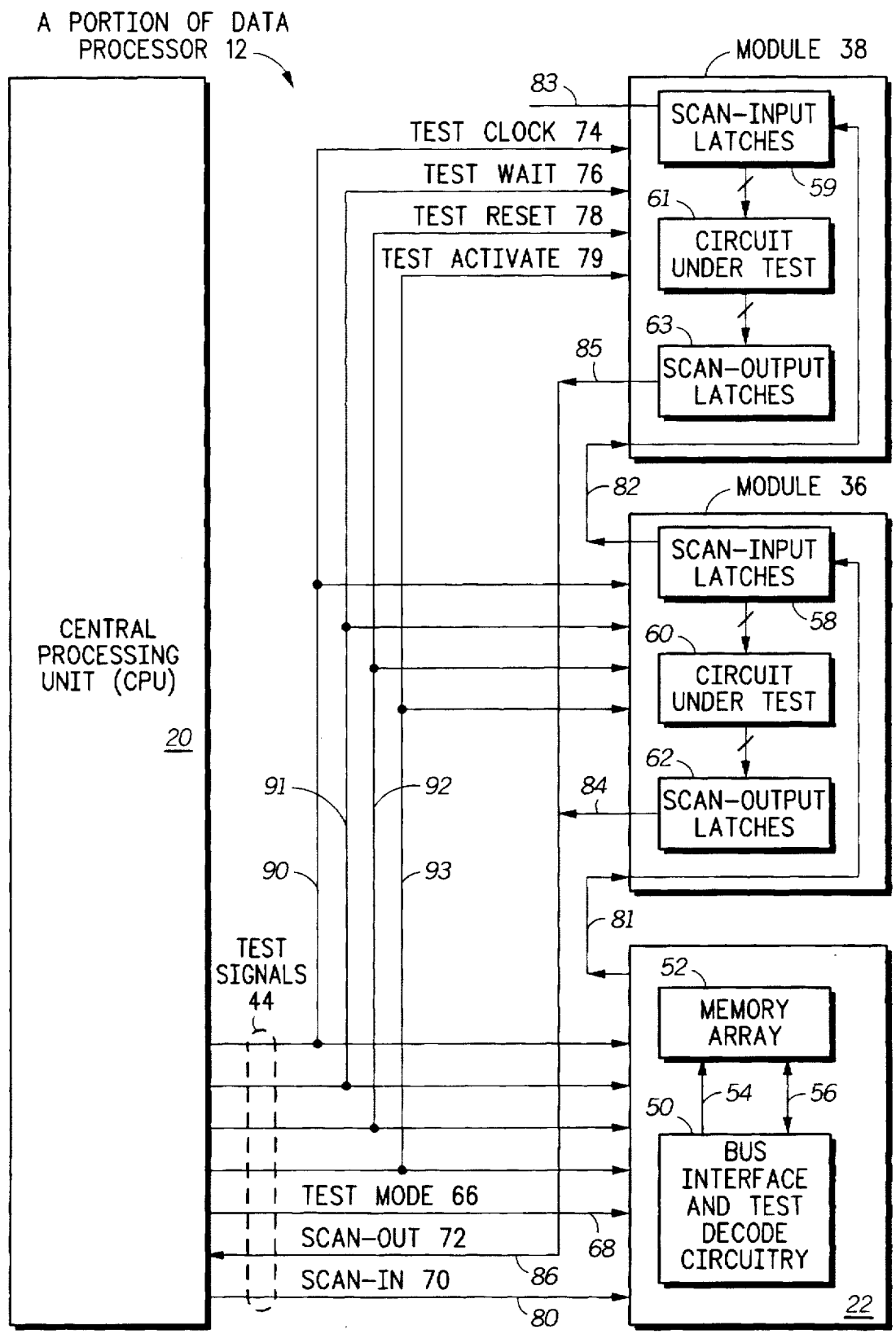
FIG. 2 illustrates, in block diagram form, control signal and data flow between the CPU and other modules of the data processor in accordance with one embodiment of the present invention.

FIG. 2 illustrates a portion of the data processor 12 of FIG. 1 in accordance with one embodiment of the present invention. Memory system 22 has bus interface and test decode circuitry 50 and memory array 52. Circuitry 50 can address the memory array 52 over address line 54. Circuitry 50 is also bidirectionally coupled to memory array 52 by parallel data bus 56 for transferring blocks of test vector bits to and from memory array 52.

Module 36 has Scan-input latches 58, circuit under test 60, and Scan-output latches 62. Module 38 has Scan-input latches 59, circuit under test 61, and Scan-output latches 63.

Test signals 44 include a Test Mode signal 66, Scan-in signal 70, a Scan-out signal 72, a Test Clock signal 74, a Wait signal 76, a Test Reset signal 78, and a Test Activate signal 79. Test Mode signal 66 may be transferred across conductor 68. Scan-in signal 70 may be transferred across conductors 80, 81, 82 and 83. Scan-out signal 72 may be transferred across conductors 84, 85 and 86 Test Clock signal 74 may be transferred across conductor 90. Wait signal 76 may be transferred across conductor 91. Test Reset signal 78 may be transferred across conductor 92, and Test Activate signal 79 may be transferred across conductor 93.

Scan-input latches 58 are coupled to conductor 81, conductor 82, and circuit under test 60. Scan-output latches 62 are coupled to circuit under test 60 and to conductor 84. Scan-input latches 59 are coupled to conductor 82, conductor 83, and circuit under test 61. Scan-output latches 63 are coupled to circuit under test 61 and to conductor 85.

Figure 3:
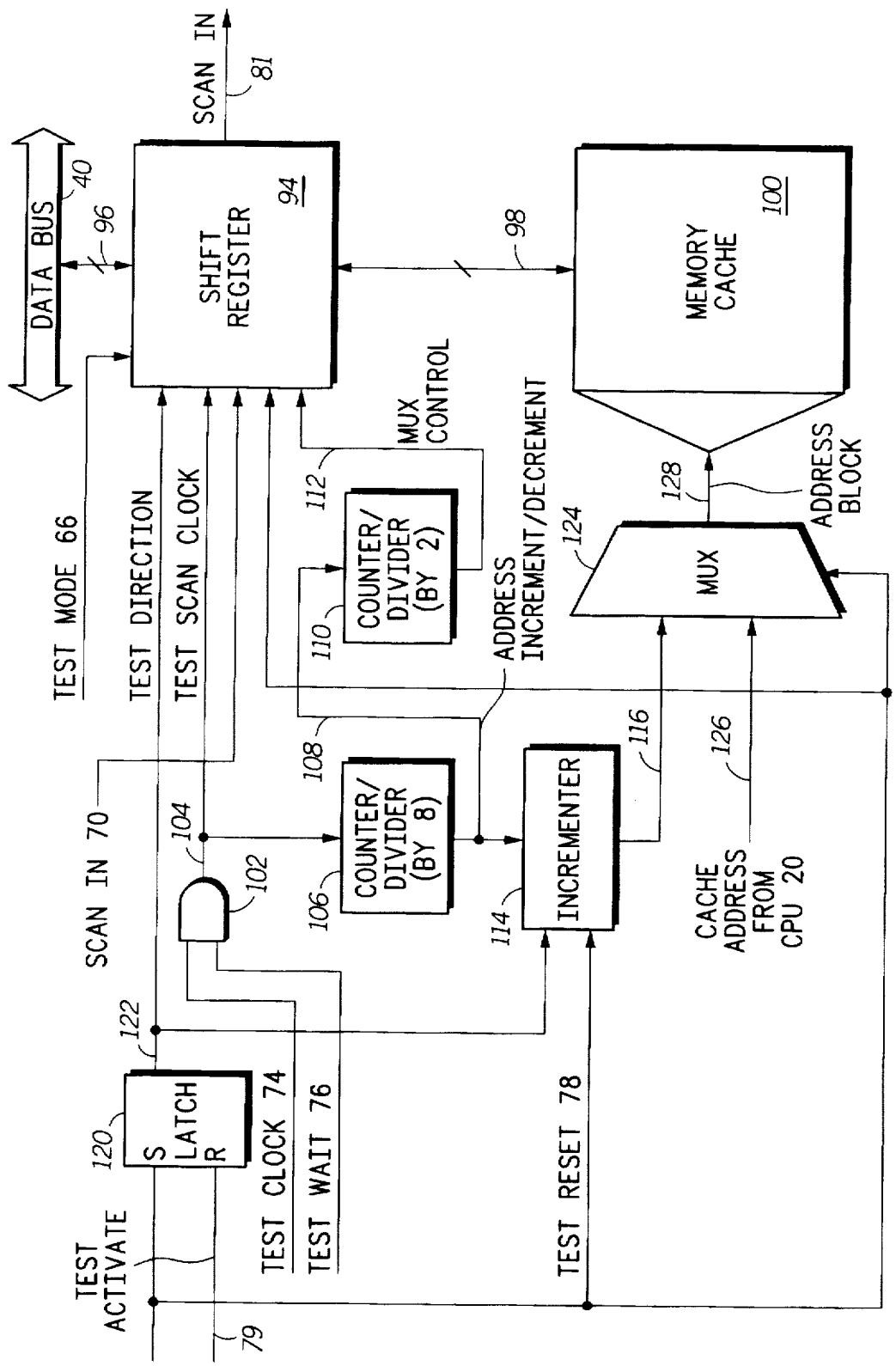
FIG. 3 illustrates, in block diagram form, a portion of the memory system of the data processor in accordance with one embodiment of the present invention.

FIG. 3 illustrates the memory system 22 of FIG. 2 in greater detail. The memory system 22 includes a shift register 94 coupled to data bus 40. A suitable shift register for this purpose would provide for four modes of operation: parallel input, parallel output, serial input and serial output. In normal operation, CPU 20 sends a Read/Write Control signal (not shown) to shift register 94. Shift register 94 is also coupled by another parallel bus 98 to the data input of a memory cache 100, such as random access memory (RAM). In the illustrated embodiment of the invention, the shift register 94 is a sixteen bit register. In a conventional operating mode, the CPU transfers data via shift register 94 to and from memory cache 100 in response to write and read commands from CPU 20, respectively.

Shift register 94 is also serially coupled to conductor 80 (shown in FIG. 2) to receive Scan-in signal 70 generated by the test vector generator in ALU 24. Shift register 94 is also coupled to conductor 81 (shown in FIG. 2) to send single bits of Scan-In signal 70 serially to module 36 for the scan test.

CPU 20 generates Test Activate signal 79 and Test Reset signal 78 which are coupled to the RESET and SET inputs respectively of S/R latch 120. Latch 120 outputs a Test Direction signal 122 which is coupled to the shift register 94 and to incrementer 114. CPU 20 also generates Test Clock signal 74 and Test Wait signal 76 which are coupled to the inputs of AND gate 102. AND gate 102 generates a Test Scan Clock signal 104 which is coupled to shift register 94. Test Scan Clock signal 104 is also identified in the timing diagram of FIG. 4 as A.

Test Scan Clock signal 104 is coupled to a counter 106 which generates an Address Increment/Decrement signal 108 for a predetermined number of input Test Scan Clock signals 104, thereby functioning as a divider. For the illustrated embodiment in which shift register 94 shifts sixteen parallel data bits into memory cache 100 at a time, the counter 106 divides Test Scan Clock signals 104 by eight, generating Address Increment/Decrement signal 108, which is also identified in the timing diagram of FIG. 4 as B.

Address Increment/Decrement signal 108 is coupled to another counter 110, which generates a Multiplexer ("MUX") Control signal 112 for a predetermined number of input signals 108, thereby functioning as a divider. In the illustrated embodiment of this invention, the counter 110 divides by 2. The MUX Control signal is also identified as D in the timing diagram of FIG. 4.

Address Increment/Decrement signal 108 is also coupled to incrementer 114, to either increment or decrement the address within memory cache 100 to be accessed in a manner to be described hereinafter. The address accessed by the register 114 is identified as C in the timing diagram of FIG. 4.

Test Reset signal 78 and Test Direction signal 122 are also coupled to incrementer 114 to control the direction of the counter 114 in a manner to be described. Incrementer 114 is also coupled by parallel bus 116 to MUX 124. MUX 124 is also coupled to CPU 20 to receive cache address signal 126. MUX 124 generates an address block signal 128 to select the address of the data block in memory cache 100 which shift register 94 either writes to or reads, depending on the stage of the BIST scan testing.

Figure 4:
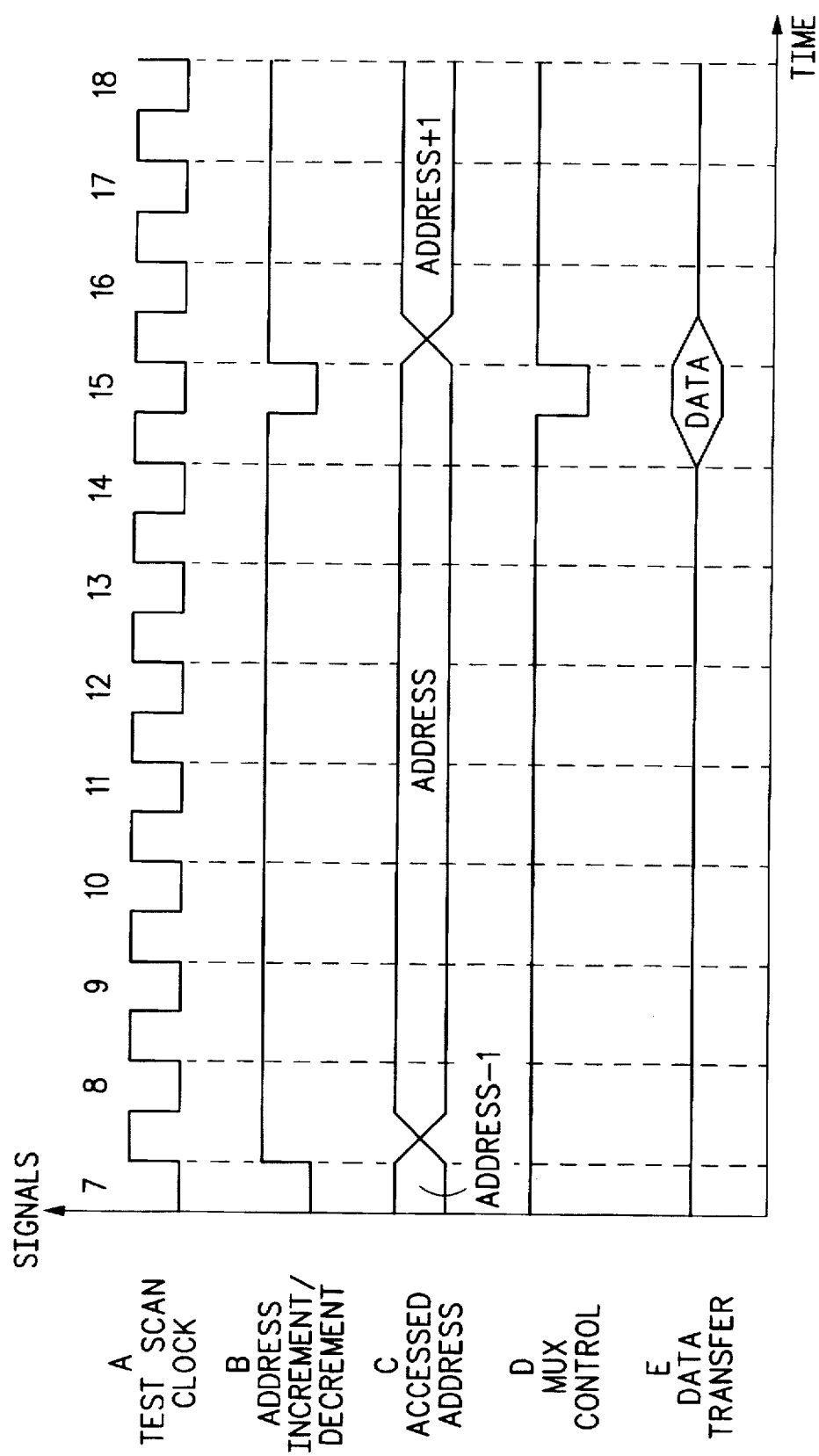
FIG. 4 is a timing diagram of the test signals used by the memory system of FIG. 3 during BIST.

FIG. 4 is a timing diagram which illustrates the timing sequence relationship among the Test Scan Clock signal 104, Address Increment/Decrement signal 108, MUX control signal 112 and the transfer of data between shift register 94 and memory cache 100. The transfer of data is identified as E in the timing diagram of FIG. 4. It should be evident that the timing sequences may vary depending on the bus and register sizes used in the design of the memory system 22.

OPERATION

BIST scan testing is a common testing methodology which can be used to test the various circuits of a microprocessor. The manner in which BIST scan testing is performed in a microprocessor is well known in the art. As shown in FIG. 1, test control circuitry in CPU 20 is used to generate the signals which are used to control the BIST scan testing. In the illustrated embodiment of the present invention, the BIST scan testing control signals include Test Mode signal 66, Test Clock signal 74, Test Wait signal 76, Test Reset signal 78, and Test Activate signal 79. Alternate embodiments of the present invention may use more, fewer, or different control signals to control the BIST scan testing.

Still referring to FIGS. 2 and 3, CPU 20 generates test vectors of pseudo-random bits during the Background Self-Test mode selected in a manner to be hereinafter described. These test vectors are initially scanned over conductor 80 into memory system 22. In this test mode, the internal memory cache 100 effectively functions as one large shift register. Once the memory system 22 has been properly loaded with the set of test vectors, CPU 20 asserts control signals which scan out the pseudo random bits through the Scan-input latches in the circuit modules. The circuits under test then generate outputs which are stored in Scan-out latches. In response to other test signals, the bits in the Scan-out latches are compressed by the CPU and then compared to the expected number to determine if there are any faults in the circuits under test.

Considering the loading of the pseudo bits into the memory system 22 in more detail, when Test Mode signal 66 is asserted, the shift register 94 in FIG. 3 ceases normal operations of shifting blocks of data from the data bus 96 to the memory cache 100, and it enters the Background Self-Test mode. In the Background Self-Test made, shift register 94 transfers single bit scan-data either from scan-in signal conductor 80 to memory cache 100 or from memory cache 100 to scan in signal conductor 81 as described below. When Test Reset signal 78 is asserted, CPU 20 outputs Scan-in signal 70 of pseudo random bits.

The asserted Test Reset signal 78 also sets the S/R latch 120, the output of which is Test Direction signal 122, directs the bit cells of shift register 94 to write its block of bits to memory cache 100 over bus 98. Provided the Test Wait signal 76 has also been asserted, AND gate 102 outputs Test Scan Clock signal 104 so that the pseudo random bits are shifted serially into shift register 94 at each Test Scan Clock signal 104 until the shift register 94 is loaded. As the block of pseudo random bits are being loaded, counter 106 also outputs an Address Increment/Decrement signal 108 to increment/decrement the address counter 114, depending on the status of Test Direction signal 122 (Test Activate signal 79 and Test Reset signal 78). Address signal 108 increments incrementer 114 when the Test Reset signal 78, and, therefore, the Test Direction signal 122, is asserted and Test Activate signal 79 is inhibited. In contrast, the signal 108 decrements address counter 114 when the Test Activate signal 79 is asserted and the Test Reset signal 78 is inhibited.

Assuming that the Test Reset signal 78 is asserted and the Test Activate signal 79 is inhibited by the CPU, the incrementer 114 selects a new address 116 for the data being scanned into shift register 94. As the last bit to fill shift register 94 is being scanned into the shift register, counter 110 outputs MUX Control signal 112, which causes shift register 94 to transfer the Scanned-in bits over parallel bus 98 to memory cache 100 for storage at the address selected by the address counter 114. Additional blocks of pseudo random bits generated by the CPU are subsequently scanned into shift register 94 until the entire set of test vectors generated by the CPU are stored in memory cache 100.

The manner in which the test vectors stored in memory cache 100 are scanned out to the circuits under test will now be described. In order to transfer the test vectors out of memory cache 100 for the scan test, the CPU next generates a Test Activate signal 79 and inhibits the Test Reset signal 78. Activate signal 79 resets S/R latch 120 to change the Test Direction signal 122 forcing data flow from the memory cache 100 to shift register 94. The assertion of the Test Activate signal 79 and the non-assertion of the Test Reset signal 78 also directs the address counter 114 to decrement rather than increment the address at which data is to be stored the next time the Address Increment/Decrement signal 108 is asserted.

As the Test Scan Clock signal 104 generates clock pulses after the assertion of the Test Activate signal 79, shift register 94 reads the data block from memory cache 100 at the last address in memory cache 100 at which a data block was written. Upon each clock pulse thereafter, a bit is shifted out over Scan-in line 81 to module 36. As the data is being shifted out, Address Increment/Decrement signal 108 decrements address register 114. Upon the shifting out of the last bit of the first block of data, MUX Control signal 112 is asserted, directing shift register 94 to read another block of data from memory cache 100 at the decremented address 116 selected by address counter 114. Shift register 94 shifts the bits of this new block of data onto the Scan-in conductor to the Scan-input latches of the selected module under test. In the illustrated embodiment, the bit is shifted across conductor 81 to Scan-input latch 58.

Referring to FIGS. 2 and 3, shift register 94 in memory 22 and Scan-input latches 58–59 in modules 36 and 38 can effectively function as one large shift register. Shift register 94 and Scan-input latches 58 and 59 can be shifted simultaneously while the shift out bit from shift register 94 is shifted over conductor 81 into Scan-input latches 58, and the shift-out bit from Scan-input latches 58 is shifted over conductor 82 into Scan-input latches 59. The shift-out bit from Scan-input latches 59 is discarded and is not used. In an alternate embodiment of the present invention, Scan-input latches 59 could use the Scan-in signal 70 to transfer serial data bits across conductor 83 to additional Scan-input latches (not shown) in another module (not shown) in data processor 12.

In alternate embodiments of the present invention, data bus 40 may provide information to modules 36 and 38 regarding which Scan-input latches 58 and 59 will be loaded. For example, if Scan-input latches 58 are not selected, the pseudo-random bit shifted in across conductor 81 may merely be shifted out across conductor 82. Thus Scan-input latches 58 may be deselected and not loaded. Thus, only the Scan-input latches 58 and 59 which are selected participate in the loading process and are loaded with pseudo-random bits. One, a portion, or all Scan-input latches 58 and 59 may be selected at the same time; but only the Scan-input latches which are selected can receive pseudo-random bits across the Scan-in signal 70 from the shift register 94.

Likewise, in some embodiments of the present invention, data bus 40 may provide information to modules 36 and 38 regarding which circuits under test 60 and 61 will be activated. For example, if circuit under test 60 is not selected, the Test Activate signal 79 will have no effect on circuit under test 60. And if circuit under test 61 is selected, the Test Activate signal 79 will effect circuit under test 61 and circuit under test 61 will produce outputs. Thus, circuit under test 61 may be selectively included or excluded as part of a particular test. One, a portion, or all circuits under test 60 and 61 may be selected at the same time; but only the circuits under test 60 and 61 which are selected use the pseudo-random bits as inputs to produce corresponding outputs.

In some embodiments of the present invention, data bus 40 may also provide information to modules 36 and 38 regarding which Scan-output latches 62 and 63 will be selected. For example, if Scan-output latches 62 are not selected, the bits stored in Scan-output latches 62 will not be serially scanned out across conductor 84. And if Scan-output latches 63 are selected, the bits stored in Scan-output latches 63 will be serially scanned out across conductor 85. Thus Scan-output latches 62 and 63 may be either selected or not selected.

One, a portion, or all Scan-output latches within a module 36 or 38 may be selected at the same time. Note that in the embodiment of the present invention illustrated in FIG. 2, only the Scan-output latches 84 and 85 within one module 36 or 38 can be selected at a time in order to prevent contention on Scan-out signal 72. Alternately, the Scan-out signal 72 could be implemented as a chain in the same manner as the Scan-in signal 80 to avoid contention.

Once the selected Scan-input latches 58 and 59 have been serially loaded with the pseudo-random bits, the Test Reset signal 78 is asserted in order to clear the Scan-output latches 62 and 63 in modules 36 and 38. In one embodiment of the present invention, the Test Reset signal 78 always clears all of the Scan-output latches 62 and 63. In an alternate embodiment of the present invention, the Test Reset signal 78 only clears the Scan-output latches 62 and 63 which are selected. The Test Reset signal 78 is then negated.

The Test Clock signal 74 is used to clock the circuitry in the circuit under test 60 and 61. The Test Clock signal 74 is also used to clock the serial shifting of the Scan-input latches 58 and 59, as well as the Scan-output latches 62 and 63. Wait signal 76 is received by the Scan-inputs latches 58 and 59 and is used to selectively disable the shifting of the Scan-input latches 58 and 59. In alternate embodiments of the present invention, more, fewer, or different test signals may be used to coordinate the BIST scan testing of modules 36 and 38.

For purposes of illustration, the following example will assume that the circuit under test 60 is selected and the circuit under test 61 is not selected. The assertion of Test Activate signal 79 causes the circuit under test which is selected to operate. Circuit under test 60 receives the pseudo-random bits from shift register 94 in memory 22 and generates corresponding output bits which are loaded and stored in Scan-output latches 62. Test Activate signal 79 is then negated by the CPU.

To prepare for the next test, shift register 94 and Scan-input latches 58 are shifted by one bit simultaneously. The shift-out bit from Scan-input latches 58 may or may not be shifted on to module 38.

However, before the next test on circuit under test 60 can be performed, the outputs from circuit under test 60, which are stored in Scan-output latches 62, must be preserved. In the illustrated embodiment of the present invention, the outputs from circuit under test 60 are all transferred to Scan-output latches in CPU 20 for storage. In one embodiment of the present invention, the outputs from the module 36 are transferred to the CPU 20 by shifting the Scan-output latches a predetermined number of bits "N". In one embodiment, "N" may be the integer 13, 14, 15, or 16. Alternate embodiments may use any positive integer for the value of "N".

In the illustrated embodiment, data compression only occurs after all the bits generated by circuit under test 60 in response to all the test vectors stored in memory cache 100 have been transferred to CPU 20. Alternately, data compression can occur after N bits are shifted from the Scan-output latches 62, and the operator does not have to wait until all test vectors has been run. The data compression may then be carried out in the manner described in the application for U.S. patent entitled "A Method and Apparatus for Generating Pseudo-Random Numbers or for Performing Data Compression in a Data Processor," Ser. No. 08/103,614, filed Aug. 9, 1993, now U.S. Pat. No. 5,416,783.

The purpose of the data compression is to compress the very long string of output bits from the Scan-output latches into a few number of bits, for example, a 16-bit signature value which can be stored in a register. The signature value is then compared to the expected result. If the signature value is different than the expected result, circuit under test 60 has failed the test. If the signature value is the same as the expected result, the circuit under test 60 has passed the test.

The test environment of the present invention will now be discussed. Referring to FIG. 1, in one embodiment of the present invention, data processor 12 is an integrated circuit which is being tested. Host computer 16 is used to control the testing from a high level. Host computer 16 may be a mainframe computer, a workstation computer, a personal computer, or even a simple terminal. Interface circuitry 14 may be a simple microprocessor board having the necessary software for communicating with data processor 12. In some embodiments of the present invention, interface circuitry 14 may be incorporated as part of host computer 16.

In one embodiment of the present invention, interface circuitry 14 provides a Reset signal 26 and a Clock signal 28 to data processor 12. In one embodiment, interface circuitry 14 and data processor 12 communicate by way of one or more bidirectional data I/O signals 30. In an alternate embodiment, interface circuitry 14 and data processor 12 communicate by way of a bidirectional background signal 32.

In one embodiment of the present invention, the self-test capabilities of the present invention may be used during a background debug mode. The background debug mode is a mode which has been implemented on the MC68HC300 family of microcontrollers (available from Motorola, Inc. of Austin, Tex.). The background debug mode allows registers in CPU 20 to be read or written to, and allows test features to be invoked.

Data processor 12 enters background debug mode when the background signal 32 is asserted while the reset signal 26 is asserted. The background signal 32 is then used as an input/output signal for serial communications between data processor 12 and interface circuitry 14. Interface circuitry 14 can transfer commands (i.e. background mode instructions), addresses, and data to data processor 12 by way of background signal 32. The background mode instructions are decoded and executed by CPU 20. In one embodiment of the present invention, the control circuitry 25 for background mode commands uses microcode to implement the control for one or more of the background instructions. Alternate embodiments of the present invention may use random logic instead of microcode in control circuitry 25.

The present invention may use the Background Self-Test mode or "bootstrap" mode disclosed in the above-referenced patent application within the existing background debug mode, which has also been implemented on the MC68HC300 family of microcontrollers. Then by transferring a predetermined value, hexadecimal $07 for example, in one embodiment of the present invention, the special Background Self-Test mode is entered.

The CPU microcode flow for the special Background Self-Test mode is selected and initiated by executing a write of a data value to a predetermined address. The data value is used to determine which module 36 or 38, as well as which circuits under test 60 and 61, will be selected for this particular test. Note that in some embodiments of the present invention, each module 36 or 38 will have a plurality of circuits under test, rather than just one circuit under test as illustrated in FIG. 2.

Referring to FIG. 2 and 3, CPU 20 generates the pseudo-random data bits to be used as test vectors. These bits are then scanned into memory array of memory system 22 for use as inputs to the circuits under test 60 and 61 which have been selected. The Scan-in signal 70 is also used to transfer the pseudo-random data bits to the circuits under test 60 and 61 which have been selected.

Referring to FIG. 2, the Test Clock signal 74, the Wait signal 76, the Test Reset signal 78, and the Activate signal 79 are used to control the actual test itself of the circuits under test 60 and 61. The result of the actual test are the outputs from the circuits under test 60 and 61. The Scan-out signal 72 is used to transfer the Scan-out data bits from the circuits under test 60 and 61 to CPU 20.

The pseudo-random data bits in the shift register 94 are then shifted one bit place. In this manner, the inputs to the circuits under test 60 and 61 are changed. A second actual test is then performed of the circuits under test 60 and 61. The Test Clock signal 74, the Wait signal 76, the Test Reset signal 78, and Test Activate signal 79 are used to control the second actual test of the circuits under test 60 and 61. The result of the second actual test are the outputs from the circuits under test 60 and 61. Scan-out signal 72 is used to transfer the Scan-out data bits from the circuits under test 60 and 61 to CPU 20. The pseudo-random data bits are then shifted one bit place, and the whole procedure is repeated in order to perform a third test.

When the Address Increment/Decrement Counter value is no longer a positive integer, the outputs from the circuits under test are compressed and the resulting signature value compared with the expected result. At this point, the BIST scan testing of the selected circuits under test 60 and 61 has been completed.

If BIST scan testing has been completed, interface circuitry 14 transfers a predetermined value, $AO (hexadecimal) in one embodiment of the present invention, the special Background Self-Test mode and the background debug mode are both exited.

Once data processor 12, and thus CPU 20, exits the described test modes, normal CPU 20 operation can resume and the circuitry in CPU 20 can execute normal operating mode instructions.

In summary, the above specification describes a method and apparatus for performing BIST scan testing using memory internal to the data processor 12 for storing an extended set of test vectors.

In one embodiment of the present invention illustrated in FIG. 3, all of the circuitry but the AND gate 102, S/R latch 120 and counters 106 and 110 were already being used by CPU 20 for other functions in a normal operating mode which were unrelated to the present invention. In addition, the conventional shift register used to read and write data blocks from and to memory cache 100 was modified to permit it to perform serial to parallel shifting, and address counter 114 was modified to control the directionality of the counter upon assertion of test mode 66. Thus, by adding a relatively small amount of circuitry, CPU 20 was now able to perform BIST scan testing with an extended set of test vectors initially stored in the existing memory internal to the data processor.

Although the present invention has been described with reference to a specific embodiment, further modifications and improvements will occur to those skilled in the art. For instance, the disclosed invention is described with reference to a microcontroller. However, the invention may be incorporated into the operation of a wide variety of highly integrated digital circuits including complex instruction set ("CISC") data processors, reduced instruction set ("RISC") data processors and digital signal processing ("DSP") devices. It is to be understood, therefore, that the invention encompasses all such modifications that do not depart from the spirit and scope of the invention as defined in the appended claims.

We claim:

1. An integrated circuit having an apparatus for performing scan testing of a plurality of circuits, the apparatus comprising:

a plurality of circuits to be scan tested;

first circuitry generating a data string for a scan test;

a memory system coupled to the first circuitry wherein in a first mode of operation, the memory system stores the data string, in a second mode of operation, the memory system outputs a portion of the data string, and in a third mode, the memory system stores data or instructions for use by the integrated circuit; and a plurality of Scan-input latches for serially receiving the data string output from the memory system in the second mode, the plurality of Scan-input latches coupled to the plurality of circuits to be tested.

2. The apparatus of claim 1, wherein the memory system comprises:

a shift register serially receiving the data string from the first circuitry and periodically outputting N bits in the first mode, where N is an integer;

a counter generating a first series of sequential addresses responsive to a number of received bits of the data string in the first mode and generating a second series of sequential addresses responsive to a number of bits outputted by the memory system in the second mode; and a memory array periodically storing the N bits outputted by the shift register at one of the first series of sequential addresses in the first modes outputting N bits indexed by one of the second series of sequential addresses as the portion of the data string in the second mode, and binarily indexing data or instructions in the third mode.

3. The apparatus of claim 2, further comprising a plurality of Scan-output latches, the plurality of Scan-output latches coupled to the plurality of circuits to be tested.

4. The apparatus of claim 3, wherein an output of the plurality of Scan-output latches is coupled to the first circuitry.

5. The apparatus of claim 3, further comprising an arithmetic logic unit for executing instructions.

6. The apparatus of claim 1, further comprising a plurality of Scan-output latches, the plurality of Scan-output latches coupled to the plurality of circuits to be tested.

7. The apparatus of claim 6, wherein an output of the plurality of Scan-output latches is coupled to the first circuitry.

8. The apparatus of claim 6, further comprising an arithmetic logic unit for executing instructions.

* * * * *